(12) United States Patent
Chang

(10) Patent No.: US 7,955,113 B2
(45) Date of Patent: Jun. 7, 2011

(54) ELECTRICAL CONNECTOR WITH A RETAINER WITH PRESSING MEMBER

(75) Inventor: Chun-Yi Chang, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 0 days.

(21) Appl. No.: 12/850,665

(22) Filed: Aug. 5, 2010

(65) Prior Publication Data

US 2011/0034044 A1    Feb. 10, 2011

(30) Foreign Application Priority Data

Aug. 5, 2009 (TW) ................ 98214419 U

(51) Int. Cl.
*H01R 13/62* (2006.01)
(52) U.S. Cl. ....................................................... 439/331
(58) Field of Classification Search .................. 439/331, 439/335, 339, 367
See application file for complete search history.

(56) References Cited

U.S. PATENT DOCUMENTS

| | | | |
|---|---|---|---|
| 6,155,848 A * | 12/2000 | Lin | 439/135 |
| 6,716,049 B1 * | 4/2004 | Gattuso et al. | 439/331 |
| 7,377,797 B2 * | 5/2008 | Tsai | 439/159 |
| 7,527,507 B2 * | 5/2009 | Liao et al. | 439/135 |
| 7,641,505 B2 * | 1/2010 | Ma | 439/485 |
| 7,815,453 B2 * | 10/2010 | Szu | 439/331 |

FOREIGN PATENT DOCUMENTS

TW    M331235    4/2008

\* cited by examiner

*Primary Examiner* — Chandrika Prasad
(74) *Attorney, Agent, or Firm* — Ming Chieh Chang; Wei Te Chung; Andrew C. Cheng

(57) ABSTRACT

An electrical connector assembly, comprises a base (4) defining an upper surface and a lower surface, a central processing unit (CPU) (3) assembled upon the upper surface of the base, a printed circuit board (PCB) (5) arranged at the lower surface of the base. A retainer (1) comprises a top cover (11), a bottom cover (12) and a side wall (13) laterally connecting the top cover and the bottom cover, the top cover forms a pivoting structure (111) extending along a first direction at a free edge thereof. A pressing member (2) comprises a shaft (21) being pivotally mounted to the pivoting structure for the pressing plate (23) to press against an upper face of the CPU.

17 Claims, 4 Drawing Sheets

ELECTRICAL CONNECTOR WITH A RETAINER WITH PRESSING MEMBER

BACKGROUND OF THE INVENTION

1. Field of the Invention

The present invention generally relates to an electrical connector assembly, and more particularly to an electrical connector assembly having a loading equipment for connecting a printed circuit board (PCB) and a central processing unit (CPU).

2. Description of Related Patent

Conventionally, an Land Grid Array (LGA) socket comprises a insulative housing, a plurality of terminals or contacts received in the insulative housing, a stiffener attaching to periphery of the insulative housing, a load plate pivotally mounted to one side of the stiffener. The load plate is arranged at an original, open position when the socket connector is not in use. The CPU is put upon the insulative housing and a user rotates the load lever by pivoting the load lever to actuate the load plate to move towards the insulative housing, and therefore, the CPU is received between the insulative housing and the load plate and electrically connects with the contacts.

Currently, the electrical connector assembly comprises so many components, containing a stiffener, a load plate, an insulative housing and a load lever, that it requires many steps in assembling said components into the connector assembly, which is rather troublesome. The load plate and the stiffener have several arcuate portions to mate with each other in the rotation of the load plate. The load plate and the stiffener have complicated shapes and need to be punched precisely. It is difficult for manufacturing the connector.

Therefore, it is desirable to provide an electrical connector assembly that eliminates the aforesaid problems.

BRIEF SUMMARY OF THE INVENTION

Accordingly, an object of the present invention is to provide an electrical connector assembly with simple structure for connecting with a central processing unit (CPU) and a printed circuit board (PCB).

In order to achieve afore-mentioned object, an electrical connector assembly comprises a base defining an upper surface and a lower surface thereof, a CPU assembled upon the upper surface of the base, a PCB arranged at the lower surface of the base; a retainer comprises a top cover, a bottom cover and a side wall laterally connecting the top cover and the bottom cover, the top cover forms a pivoting structure extending along a first direction at a free edge thereof; and a pressing member comprises a shaft being pivotally mounted to the pivoting structure and a pressing plate to press against an upper face of the CPU.

Other objects, advantages and novel features of the invention will become more apparent from the following detailed description of the present embodiment when taken in conjunction with the accompanying drawings.

DETAILED DESCRIPTION OF THE INVENTION

Figure 1:
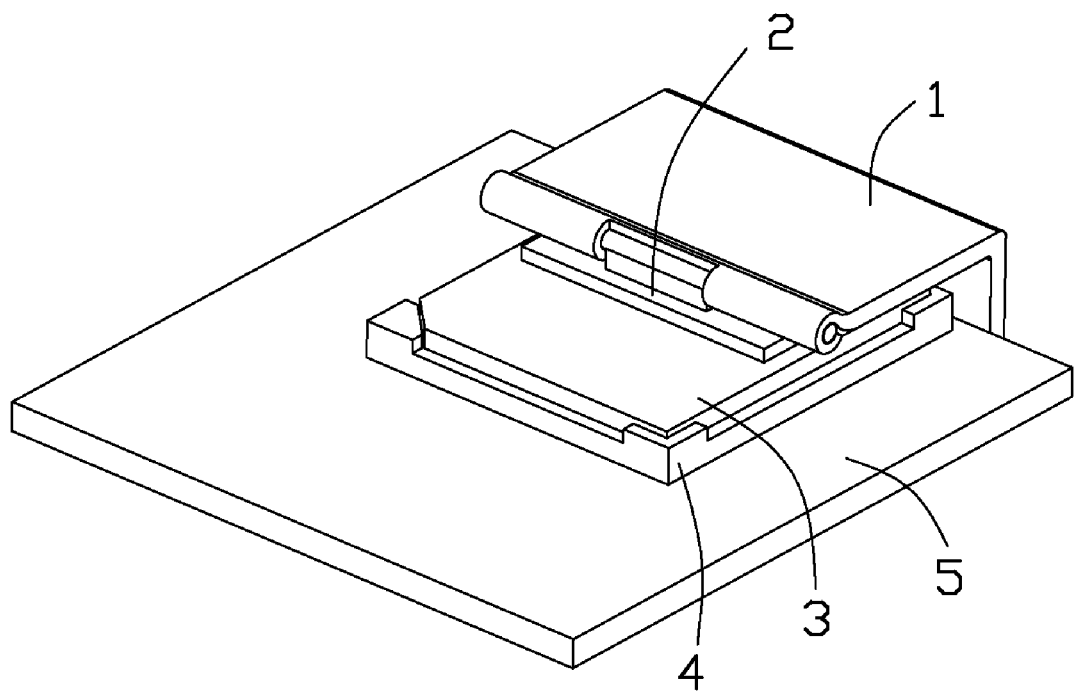
FIG. 1 is a perspective, assembled view of an electrical connector assembly having a CPU and a PCB in accordance to the present invention.
Figure 2:
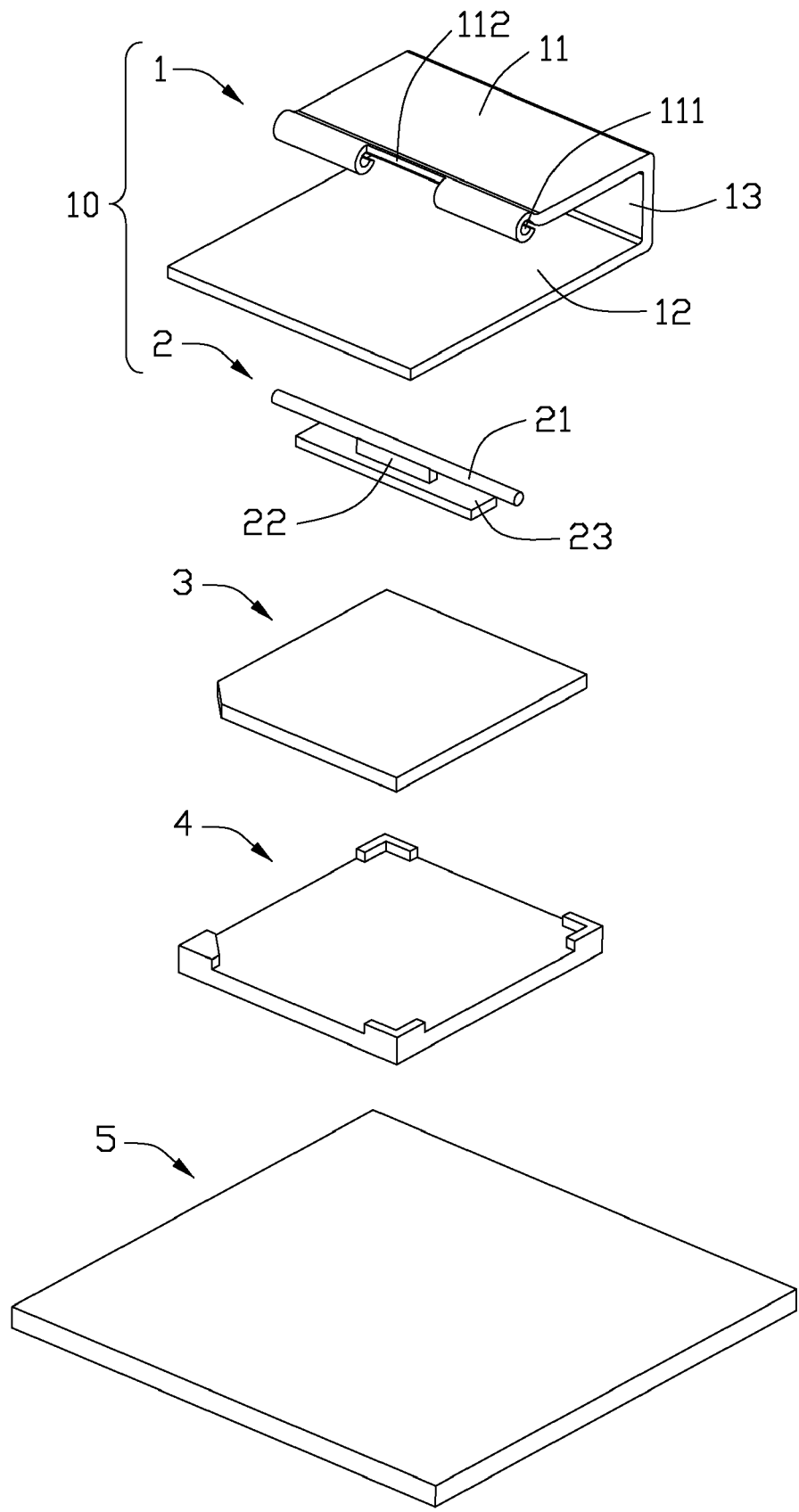
FIG. 2 is a perspective, exploded view of the electrical connector assembly.
Figure 3:
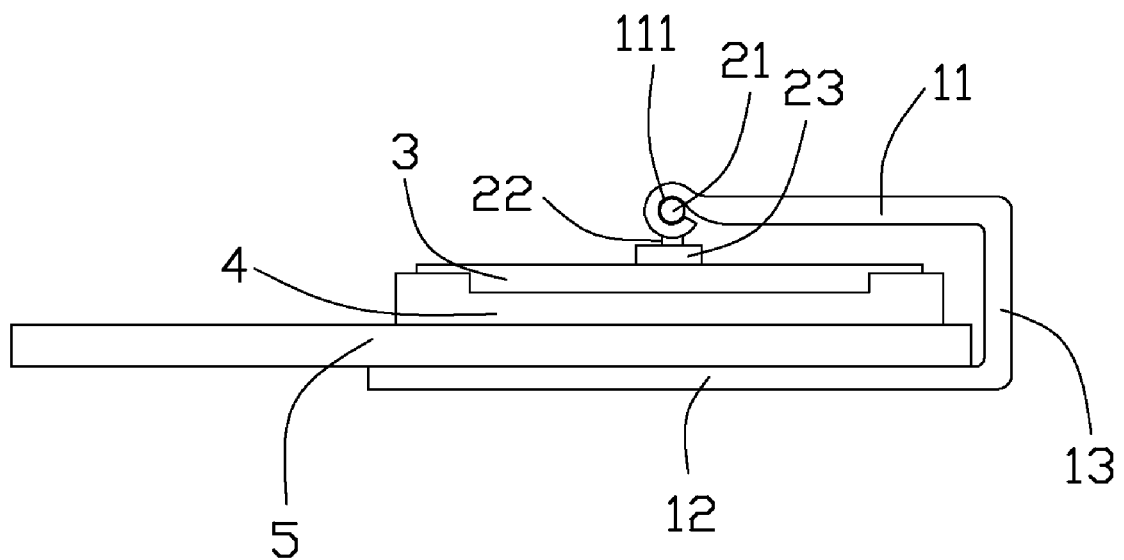
FIG. 3 is a side view of the electrical connector assembly in a closed position.

Referring to FIGS. 1-3, an electrical connector assembly of the present invention is used for connecting a central processing unit (CPU) 3 and a printed circuit board (PCB) 5. The electrical connector assembly comprises a loading equipment 10 and a base 4, such as a socket connector. Said loading equipment 10 comprises a retainer 1 and a pressing member 2 pivotally assembled to the retainer 1.

The retainer 1 is substantially "U" shape, and comprises a horizontal top cover 11, a bottom cover 12 parallel to the top cover 11, and a vertical side wall 13 connecting the top cover 11 and the bottom cover 12. The PCB 5, the CPU 3 and the base 4 are loadingly arranged between the top cover 11 and the bottom cover 12 when the pressing member 2 of the loading equipment 10 is located at an open position.

The top cover 11 is scrolled into a pair of spaced roll portions 111 at a free end thereof, The roll portions 111 define a cavity. An interspace 112 is defined between the pair of roll portions 111. In an alternative embodiment, only one roll portion 111 is formed at the end of the top cover 11 and the interspace 112 is located at a side of the roll portion 111.

The pressing member 2 has a shaft 21, a pressing plate 23 and a neck portion 22. The shaft 21 and the roll portion 111 are both circle, and the shaft 21 is rotatablely received in the roll portion 111. The neck portion 22 is received in the interspace 112, and width of the interspace 112 is same as the connect portion 22 to receive the neck portion 22 as the pressing member 2 rotate around the shaft 21. The pressing member 2 is movable between an open position at which the neck portion 22 is coplanar with the top cover 11 and a closed position at which the neck portion 22 is vertical to the top cover 11.

Figure 4:
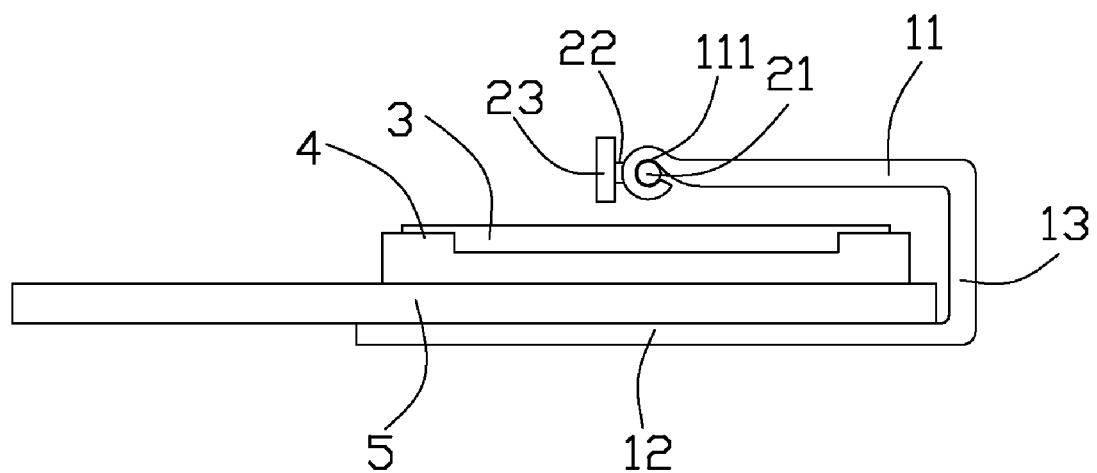
FIG. 4 is a side view of the electrical connector assembly in open position.

Reference to FIGS. 3-4, the base 4 defines an upper surface (not labeled) and a lower surface (not labeled). Contacts or terminals extend through the upper surface and the lower surface of the base 4 for connecting the CPU 3 and the PCB 5. The top cover 11 of the loading equipment 10 is arranged on the top side of the CPU 3 and the bottom cover 12 is arranged under the PCB 5 to support the PCB 5.

After the CPU 3 is assembled in the base 4, rotate the pressing member 2 from the open portion to the close position to make the pressing plate 23 press on the CPU 3. As the pressing member 2 in the close position, the connecting member 22 and the pressing plate 23 move into the receiving space. The pressing plate 23 is located between the top cover 11 and the bottom cover 12.

In the alternative embodiment, a user can assemble the CPU 3 to the base 4, and keep the pressing member 2 in the open position, slide the loading equipment 10 to the base 4 to a predetermined position, then rotate the pressing member 2 to press the CPU 3.

As the pressing member 2 presses on the CPU 3, the elasticity between the CPU 3 and the PCB 5 is kept thereby.

While a preferred embodiment in accordance with the present invention has been shown and described, equivalent modifications and changes known to persons skilled in the art according to the spirit of the present invention are considered within the scope of the present invention as described in the appended claims.

What is claimed is:

1. An electrical connector assembly comprising:
a base defining an upper surface and a lower surface and retaining a plurality of contacts extending beyond the upper and lower surfaces;
a printed circuit board (PCB) arranged at the lower surface of the base and electrically connecting with the contacts;
a central processing unit (CPU) assembled upon the upper surface of the base;
a retainer comprising a top cover, a bottom cover, and a side wall laterally connecting the top cover and the bottom cover, the top and bottom covers and the side wall cooperatively defining a receiving space for the base, the PCB, and the CPU, the top cover comprising a pivoting structure extending along a first direction at a free edge thereof; and
a pressing member comprising a shaft mounted to the pivoting structure and a pressing plate, the shaft being pivotable relative to the pivoting structure for the pressing plate to press against an upper face of the CPU.

2. The electrical connector as claimed in claim 1, wherein the bottom cover of the retainer is supportedly located under the PCB.

3. The electrical connector as claimed in claim 1, wherein the pivoting structure is wrapped to define a cavity for receiving the shaft.

4. The electrical connector as claimed in claim 1, wherein the pivoting structure has a pair of spaced roller portions to define an interspace therebetween.

5. The electrical connector as claimed in claim 4, wherein the pressing member comprises a neck portion between the shaft and the pressing plate for being received in the interspace.

6. The electrical connector as claimed in claim 5, wherein the pressing member is moveable between an open position at which the neck portion is coplanar with the top cover and a closed position at which the neck portion is vertical to the top cover.

7. The electrical connector as claimed in claim 6, wherein the pressing plate is located in the receiving space at the closed position.

8. A loading equipment for loading a central processing unit (CPU), a printed circuit board (PCB), and a base with terminals electrically connecting the CPU and the PCB, comprising:

a retainer having a top cover, a bottom cover and a side wall laterally connecting the top cover and the bottom cover; and
a pressing member connecting to the top cover and having a pressing plate to press the CPU wherein said pressing member is pivotally mounted to the top cover.

9. The loading equipment as claimed in claim 8, wherein the retainer is substantially U-shaped.

10. The loading equipment as claimed in claim 9, wherein the top cover has a roll portion, and the pressing member has a shaft rotatably received in the roll portion.

11. The loading equipment as claimed in claim 10, wherein the top cover is scrolled to form the roll portion.

12. The loading equipment as claimed in claim 10, wherein the pressing member has a neck portion connecting the shaft and the pressing plate, and the top cover forms a pair of spaced roller portions which define an interspace therebetween for receiving the neck portion.

13. The loading equipment as claimed in claim 8, wherein said pressing member is assembled to a front edge of said top cover.

14. An electrical assembly comprising:
a retainer including opposite top cover and bottom cover commonly defining a space therebetween in a vertical direction, said space communicating with an exterior laterally via a front opening, said top cover being deflectable relative to the bottom cover;
a printed circuit board with a connector thereon and an electronic component seated upon the connector together forming a sub-assembly which is adapted to be inserted into the said space laterally; and
a pressing member being discrete from while connected to a front edge region of the top cover adjacent to the front opening; wherein
said pressing member is moveable relative to the top cover to comply with insertion or withdrawal of the sub-assembly with regard to the space.

15. The electrical assembly as claimed in claim 14, wherein said pressing member is pivotally assembled to the top cover.

16. The electrical assembly as claimed in claim 14, wherein said pressing member is located around a center region of the electronic package in a front-to-back direction.

17. The electrical assembly as claimed in claim 14, wherein said pressing member includes a press plate intimately abutting against the electronic package when the sub-assembly is inserted into the space.

* * * * *